(12) United States Patent
Sung et al.

(10) Patent No.: US 6,849,499 B2
(45) Date of Patent: Feb. 1, 2005

(54) PROCESS FOR FLASH MEMORY CELL

(75) Inventors: Hung-Cheng Sung, Hsinchu (TW);
Han-Ping Chen, Hsin-Chu (TW);
Cheng-Yuan Hsu, Ma-gou (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/331,370

(22) Filed: Dec. 30, 2002

(65) Prior Publication Data

US 2003/0134473 A1 Jul. 17, 2003

Related U.S. Application Data

(63) Continuation-in-part of application No. 09/690,117, filed on Jun. 28, 2000, now abandoned.

(51) Int. Cl.[7] ...................... H01L 21/336; H01L 29/788

(52) U.S. Cl. ...................... 438/257; 438/260; 438/201; 257/315; 257/321

(58) Field of Search .............................. 438/257, 258, 438/259, 260, 261, 264, 265, 201; 257/314, 315, 316, 317, 321

(56) References Cited

U.S. PATENT DOCUMENTS

| 4,861,730 A | * | 8/1989 | Hsia et al. ................. 257/316 |
| 5,453,388 A | * | 9/1995 | Chen et al. ................ 438/266 |
| 5,597,751 A | * | 1/1997 | Wang ........................ 438/261 |
| 5,736,443 A | * | 4/1998 | Park et al. ................. 438/257 |
| 5,783,473 A | * | 7/1998 | Sung ......................... 438/265 |
| 6,090,668 A | * | 7/2000 | Lin et al. ................... 438/266 |

* cited by examiner

Primary Examiner—Kevin M. Picardat
(74) Attorney, Agent, or Firm—Thomas, Kayden, Horstemeyer & Risley

(57) ABSTRACT

A method is provided for forming a flash memory cell having an amorphous silicon floating gate capped by a CVD oxide, and a control gate formed over an intergate oxide layer formed over the oxide cap. Amorphous silicon is first formed over a gate oxide layer over a substrate, followed by the forming of a silicon nitride layer over the amorphous silicon layer. Silicon nitride is patterned to have a tapered opening so that the process window for aligning the floating gate with the active region of the cell is achieved with a relatively wide margin. Next, an oxide cap is formed over the floating gate. Using an oxide deposition method in place of the conventional polyoxidation method provides a less bulbous oxide formation over the floating gate, thus, yielding improved erase speed for the cell. The invention is also directed to a flash memory cell fabricated by the disclosed method.

23 Claims, 5 Drawing Sheets

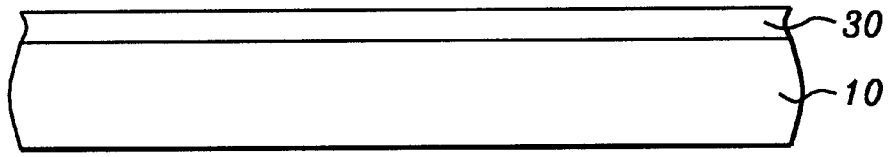
FIG. 1a – Prior Art
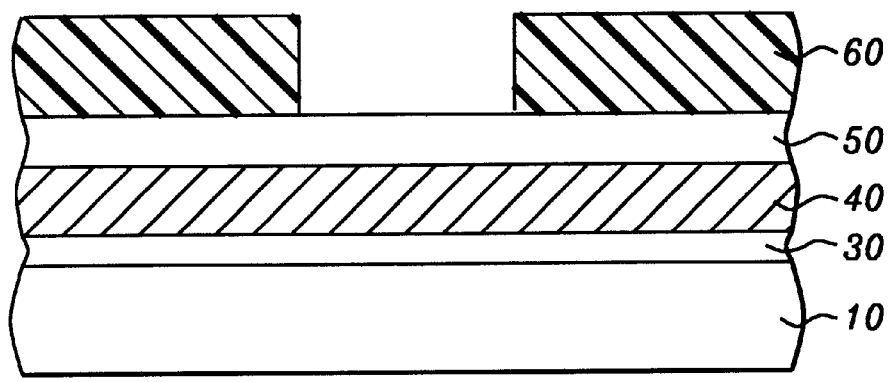
FIG. 1b – Prior Art
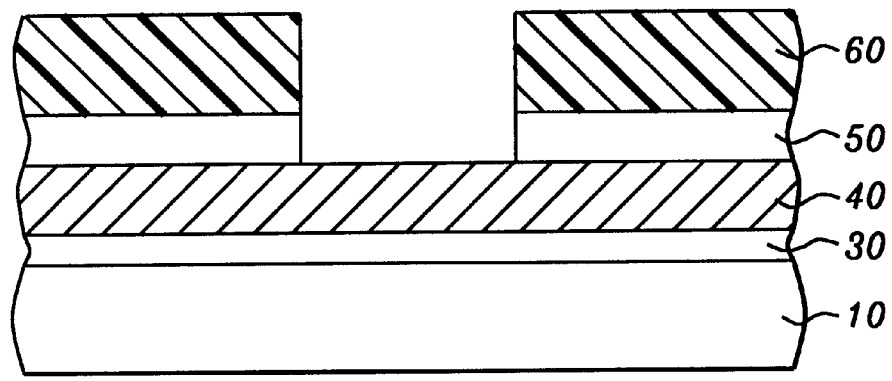
FIG. 1c – Prior Art

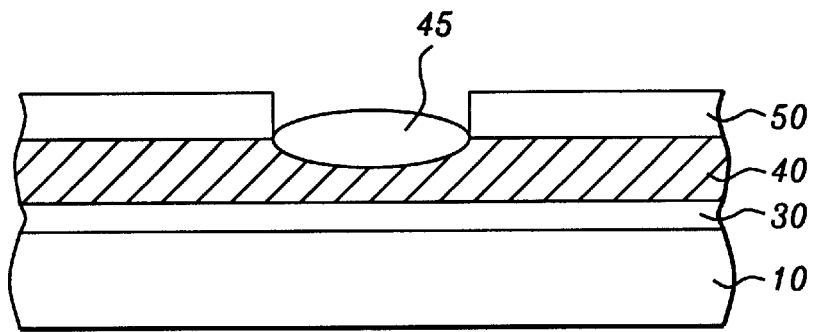
*FIG. 1d – Prior Art*
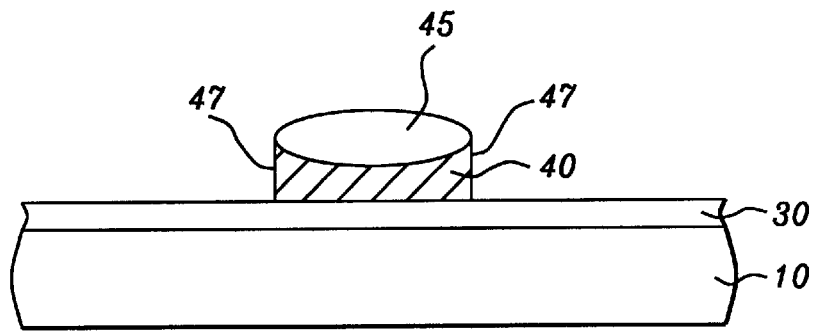
*FIG. 1e – Prior Art*
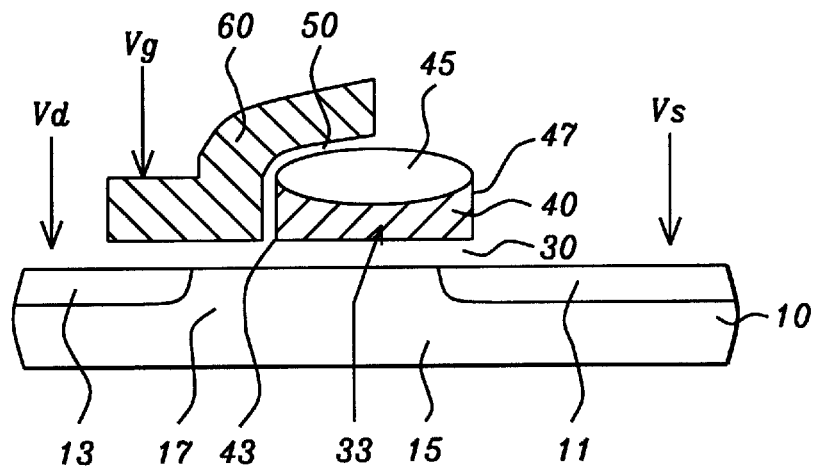
*FIG. 1f – Prior Art*

PROCESS FOR FLASH MEMORY CELL

This is a continuation-in-part of application Ser. No.: 09/690,117, filed on Jun. 8, 2000 now abandoned.

BACKGROUND OF THE INVENTION (1) Field of the Invention

The present invention relates to split-gate memory cells used in flash EEPROMs (Electrically Erasable Programmable Read Only Memories), and in particular, to a novel process for forming a flash memory cell.

(2) Description of the Related Art

A flash memory cell provides, with the use of a floating gate, nonvolatility to what is intrinsically volatile with the metal-oxide semiconductor (MOS) technology that is widely used in the semiconductor memory industry of today. As is well known, the term "flash" refers to the fact that the contents of the whole memory array, or of a memory block (sector) is erased in one step. The speed with which a memory cell can be programmed and erased is determined to a large extent by the geometrical shape and the dimensional characteristics of the floating gate as well as by the properties of the surrounding dielectric material that help retain the programmed information (charge) in the floating gate for extended periods of time. It is important, therefore, to be able to form cells with superior qualities for speed and retention of data, and it is for this purpose that a new method for forming flash memory cell is disclosed in the present invention.

Conventionally, and as is described more fully below, the floating gate of a split gate memory cell is formed by growing polysilicon oxide, or, polyoxide, on the polysilicon layer that eventually becomes the floating gate while the overlying polyoxide is used as a hard mask to etch the polysilicon gate. However, depending upon the doping, grain size and the oxidation speed of the polysilicon, there is formed around the edges of the polyoxide a protrusion of a particular shape, usually variations on the well known gate bird's beak, into the polysilicon which affects the erase speed of the cell and hence the performance of the memory device. Normally, the floating gate assumes a bulbous shape around the edges, which in turn adversely affects the speed of the cell. A different technique of forming the oxide over the polysilicon gate is proposed in this invention so that the edge of the underlying floating gate is well-defined and the speed of the cell is improved. The disclosed method also provides an improved alignment tolerance between the floating gate and the active region of the cell.

Memory devices include electrically erasable and electrically programmable read-only memories (EEPROMs) of flash electrically erasable and electrically programmable read-only memories (flash EEPROMs). Many types of memory cells for EEPROMs or flash EEPROMs may have source and drains regions that are aligned to a floating gate or aligned to spacers. When the source and drain regions are aligned to the floating gate, a gate electrode for a select transistor is separate from the control gate electrode of the floating gate transistor. Separate select and control gates increase the size of the memory cell. If the source and drain regions are aligned to a spacer formed after the floating gate is formed, the floating gate typically does not overlie portions of the source and drain regions. Programming and erasing performance is degraded by the offset between the floating gate and source and drain regions.

Most conventional flash-EEPROM cells use a double-polysilicon (poly) structure of which the well known split-gate cell is shown in FIGS. 1g. The forming of the cell is shown in FIGS. 1a-1f which will be described shortly. In the final form of the cell shown in FIG. 1f, a MOS transistor is formed on a semiconductor substrate (10) having a first doped region (11), a second doped region (13), a channel region (15), a gate oxide (30), a floating gate (40), intergate dielectric layer (50) and control gate (60). Substrate (10) and channel region (15) have a first conductivity type, and the first (11) and second (13) doped regions have a second conductivity type that is opposite the first conductivity type.

As seen in FIG. 1f, the first doped region, (11), lies within the substrate. The second doped region, (13), lies within substrate (10) and is spaced apart form the first doped region (11). Channel region (15) lies within substrate (10) and between first (11) and second (13) doped regions. Gate oxide layer (30) overlies substrate (10). Floating gate (40), to which there is no direct electrical connection, and which overlies substrate (10), is separated from substrate (10) by a thin layer of gate oxide (30) while control gate (60), to which there is direct electrical connection, is generally positioned over the floating gate with intergate oxide (50) therebetween.

In the structure shown in FIG. 1f, control gate (60) overlaps the channel region, (17), adjacent to channel (15) under the floating gate, (40). This structure is needed because when the cell is erased, it leaves a positive charge on the floating gate. As a result, the channel under the floating gate becomes inverted. The series MOS transistor (formed by the control gate over the channel region) is needed in order to prevent current flow from control gate to floating gate. The length of the transistor, that is the overlap of the control gate over the channel region (17) determines the cell performance. Furthermore, the shape of the edge (43) and, in particular, that of edge (47) can affect the programming of the cell. It is disclosed in this invention that the shape and size of edge (47) will affect the programming erase speed of the cell substantially. The relatively rounded shape that is found in conventional cells shown in FIG. 1g and which affects the erase speed adversely is the result of the commonly used process which is illustrated in FIGS. 1a-1f.

In FIG. 1a, layer of gate oxide (30) is thermally grown over substrate (10) using conventional methods. Next, a first polysilicon layer (40) is formed followed by the deposition of nitride layer (50). A photoresist layer (60) is then spun over the substrate and then patterned with a floating gate pattern as shown in FIG. 1b, which in turn, is etched into the nitride layer (50) as shown in FIG. 1c. The photoresist layer, which is no longer needed, is removed. Next, the first polysilicon that is exposed in the pattern openings in the nitride layer is oxidized to form polyoxide (45) as shown in FIG. 1d. Subsequently, the nitride layer is removed where now polyoxide (45) serves as a hard mask to remove all the first polysilicon portions except those that are covered by the polyoxide (FIG. 1e). As is well known in the art, this is usually accomplished by main etch followed by over-etch. It is at this etching step that the corner edge (47) is usually rounded off, as seen in FIG. 1e, which is not desirable for achieving fast program erase speed described below. It will be shown later in the embodiments of this invention that by employing a different process step, the sharpness of corner edge (47) can be preserved such that charge transfer (33) between substrate (10) and floating gate (40), and then the charge transfer (53) between the floating gate and control gate, (60), is fast. The control gate is formed by depositing a second polysilicon layer over intergate layer (50), also known as interpoly, which separates the two polysilicon layers, namely, the floating polygate and the control polygate.

To program the transistor shown in FIG. 1f, charge is transferred from substrate (10) through gate oxide (30) and is stored on floating gate (40) of the transistor. The amount of charge is set to one of two levels to indicate whether the cell has been programmed "on" of "off." "Reading" of the cell's state is accomplished by applying appropriate voltages to the cell source (11), Vs, drain (13), Vd, and to control gate (60), Vg, and then sensing the amount of charge on floating gate (40). To erase the contents of the cell, charges are removed from the floating gate by transferring them to the word line (control gate) through the gate oxide. The path of the charge transfer is shown by arrows (33) and (43) in FIG. 1f.

This programming and erasing of an EEPROM is accomplished electrically and in-circuit by using Fowler-Nordheim (FN) tunneling for erasing, and channel-hot electron (CHE) injection for programming, as is well known in the art. FN tunneling usually requires higher voltage than the CHE mechanism. It is common practice use FN tunneling for both write and erase for NAND type of cell architecture, while CHE programming and FN tunneling erasure is used for NOR circuits. The latter approach is shown in FIG. 1f. Thus, in the programming mode, source (11) is coupled to the floating gate through a high voltage which in turn creates a high electric field between floating gate (40) and control gate (60), thereby causing injection of CHEs from substrate (10) to floating gate (40) in FIG. 1f. In the erase mode, on the other hand, the control gate is impressed with a high voltage and electrons are injected from the floating gate to the control gate through the FN tunneling mechanism, usually aided by the poly tip of the floating gate.

Several different methods of forming split-gate flash memory cells are described in prior art. Sung in U.S. Pat. No. 5,783,473 teaches a method of manufacturing a split gate flash memory unit where an asperity effect, which is said to cause a detrimental "point discharge" phenomenon, is minimized. A method of making a high density split gate nonvolatile memory cell is proposed by Hsia, et al., in U.S. Pat. No. 4,861,730 by providing a reduced channel length. Wang, on the other hand, shows a single-side oxide sealed salicide process for EEPROMs in U.S. Pat. No. 5,597,751. None of the cited prior art teaches a method to form, nor a structure having, a recess in a polysilicon layer to fabricate a floating gate containing a sloped edge region wherein a sharp poly tip is formed to improve the erase speed of a split gate flash memory cell. Such a method and structure are disclosed in the embodiments of this invention.

SUMMARY OF THE INVENTION

It is therefore an object of this invention to provide method of forming a novel flash memory cell with improved erase speed.

It is another object of this invention to provide a method of forming an oxide cap over a floating gate without the detrimental rounding effect in order to improve erase speed of the flash memory cell.

It is yet another object of this invention to provide a method of improving the production process margin for aligning the floating gate to the active region of a flash memory cell.

These objects are accomplished by providing a substrate having active regions defined by shallow trench isolation regions in said substrate; forming a gate oxide layer over said substrate; forming a silicon (Si), i.e., amorphous silicon ($\alpha$-Si) or polysilicon (poly-Si), layer over said gate oxide layer; forming a first nitride layer over said Si layer; forming a tapered opening in said first nitride layer along a first axis of said substrate over said STI regions to form a first hardmask over said Si layer; using said first hardmask to etch underlying said Si layer to expose STI regions and form a fist edge of an Si floating gate; removing said first nitride layer, forming a second nitride layer over said Si layer; forming a second opening in said second nitride layer along a second axis of said substrate to form a second hardmask exposing portions of said Si layer in said second openings; using said second hardmask to form an oxide cap over said Si layer exposed in said second openings; removing said second nitride layer; etching said Si layer adjacent said oxide cap to form a second edge to complete the forming of said Si floating gate; forming an intergate oxide layer over said Si floating gate; forming an Si control gate over said intergate oxide layer; forming an intergate oxide layer over said oxide cap; and forming a control gate over said intergate oxide layer.

These objects are further accomplished by providing a flash memory cell having an amorphous silicon ($\alpha$-Si) floating gate overlying but separated from said substrate by a gate oxide layer; an oxide cap formed over said $\alpha$-Si floating gate; an intergate oxide layer over formed over said oxide cap over said $\alpha$-Si floating gate; and an $\alpha$-Si control gate formed over said intergate oxide layer.

BRIEF DESCRIPTION OF THE DRAWINGS

FIGS. 1a-1f are cross-sectional views of a portion of a semiconductor substrate showing the steps of forming a conventional flash memory cell.

DESCRIPTION OF THE PREFERRED EMBODIMENTS

Figure 2A:
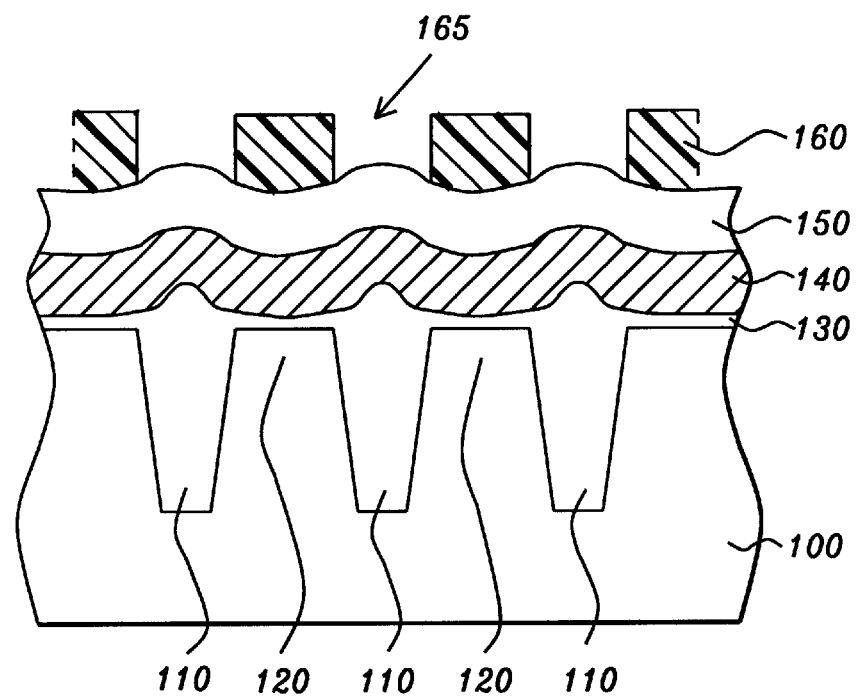
FIG. 2a is a cross-sectional view of a portion of a semiconductor substrate showing the forming of shallow trench isolation regions within the substrate and a layer of gate oxide, a layer of amorphous silicon and a layer of silicon oxynitride thereon, according to this invention.

Referring now to the drawings, in particular to FIGS. 2a-2f, there are shown steps of forming a flash memory cell having an oxide cap, instead of the conventional polyoxide, formed over a silicon (Si), i.e., amorphous silicon ($\alpha$-Si) or polysilicon (poly-Si), floating gate, thereby improving the program and erase speed of the cell. The improvement in the speed results from the sharper formation on the edge of the oxide cap over the floating gate.

FIG. 2a shows a partial cross section of a semiconductor substrate, preferably silicon. Following methods well known in the art, substrate (100) is provided with shallow trench isolation (STI) regions (110) separating active device regions (120) as shown in FIG. 2a. As shown in the same Figure, a gate oxide layer, (130), is formed over substrate (100). Gate oxide (130) can be formed by thermal oxidation process at a temperature between about 800° C. to 900° C. Alternatively, the gate oxide can be formed by an atmospheric or low pressure chemical vapor deposition (LPCVD) process as is well known. Gate oxide layer (130) has a thickness between about 80 to 110 angstroms (Å).

A silicon (Si), i.e., amorphous silicon ($\alpha$-Si) or polysilicon (poly-Si), layer (140) is next deposited over the gate oxide layer. The use of amorphous silicon has the known advantage of producing a relatively smooth surface, as compared to polysilicon. This property will be used to form a relatively sharper edge for the floating gate that will be formed from the Si layer, which in turn will enhance the speed of the flash memory cell. The preferred thickness of the Si layer, i.e., amorphous silicon ($\alpha$-Si) or polysilicon (poly-Si), is between about 900 to 1500 Å.

Next, first nitride layer (140) is formed over layer (130), as shown in FIG. 2a. The layer is chemical vapor deposited (CVD) by reacting $SiCl_2H_2$, $NH_3$ at a temperature between about 700 to 800° C. The preferred thick of SiN layer (140) is between about 500 to 1000 Å.

Figure 2B:
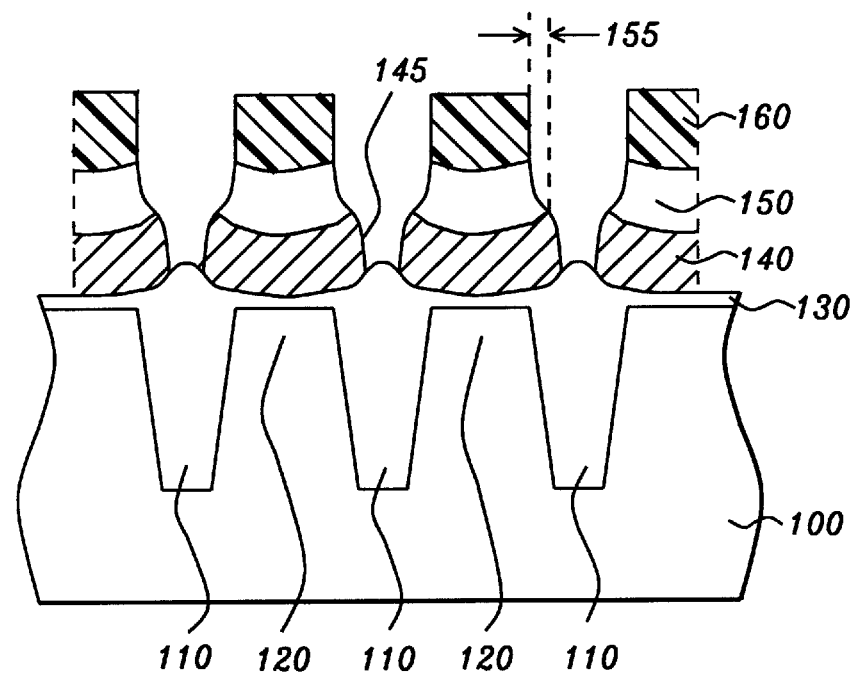
FIG. 2b is a cross-sectional view of a portion of the substrate of FIG. 2a showing the forming of a tapered opening in the silicon oxynitride layer of this invention.
Figure 2C:
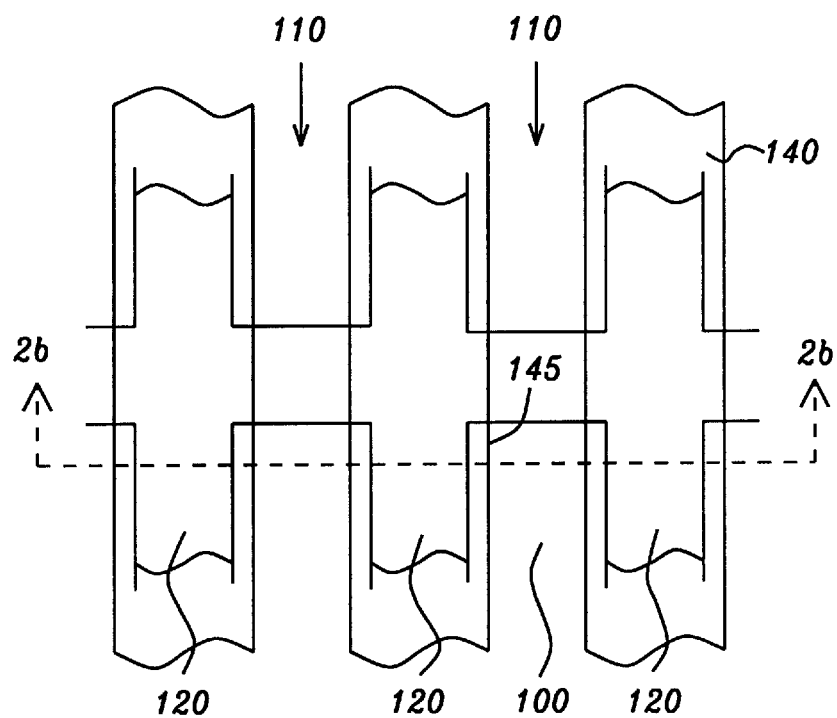
FIG. 2c is a top view of the substrate of FIG. 2b showing the forming of the tapered opening along one axis of the substrate, according to this invention.

At the next step, using conventional techniques, a first photoresist layer (160) is formed over the $Si_3N_4$ layer to form a photoresist mask having patterns (165) corresponding to areas where floating gates are to be defined as shown in FIG. 2b. It is a main feature of the present invention that pattern (165) is formed to enable a tapered etch. In this manner, the floating gate (130) to be formed at the subsequent step will have an alignment margin wider than practiced with conventional techniques. Thus, patterns (165) are then etched into the $Si_3N_4$ layer (150) forming openings with a taper (155) between about 0.065 to 0.075 micrometers ($\mu$m), as shown in FIG. 2b. The etching is accomplished using a recipe comprising gases Ar, $CHF_3$, $C_4F_8$. Then, photoresist layer is removed and the resulting patterned $Si_3N_4$ with tapered openings is used as a hardmask to etch the now exposed $\alpha$-Si layer, (130). It will be noted that the etching of layer (130) reaches the isolation trenches (120) and forms the first edge (145) of floating gate (130) parallel to a first axis of the substrate as shown in FIG. 2b. The first edge of the $\alpha$-Si layer along trench (120) is better seen in a top view of the substrate shown in FIG. 2c.

Silicon nitride layer (140) is then wet stripped using a recipe comprising $H_3PO_4$ at a temperature between about 155 and 160° C. Next, silicon nitride (SiN) is formed over the substrate, including over the $\alpha$-Si layer, (130) and trenches (120), and etched back using conventional techniques. SiN can be deposited by low pressure chemical vapor deposition (LPCVD) at a temperature between about 700 to 800° C. using, for example, dichlorosilane ($SiCl_2H_2$) and ammonia ($NH_3$). The etching is accomplished at low pressure in a reactive ion etcher (RIE) or in a high-density plasma (HDP) etcher using a gas mixture such as carbon tetrachloride ($CF_4$) and hydrogen ($H_2$). The preferred thickness of SiN layer (170) shown in another top view in FIG. 2d is between about 500 to 1000 Å.

Figure 2D:
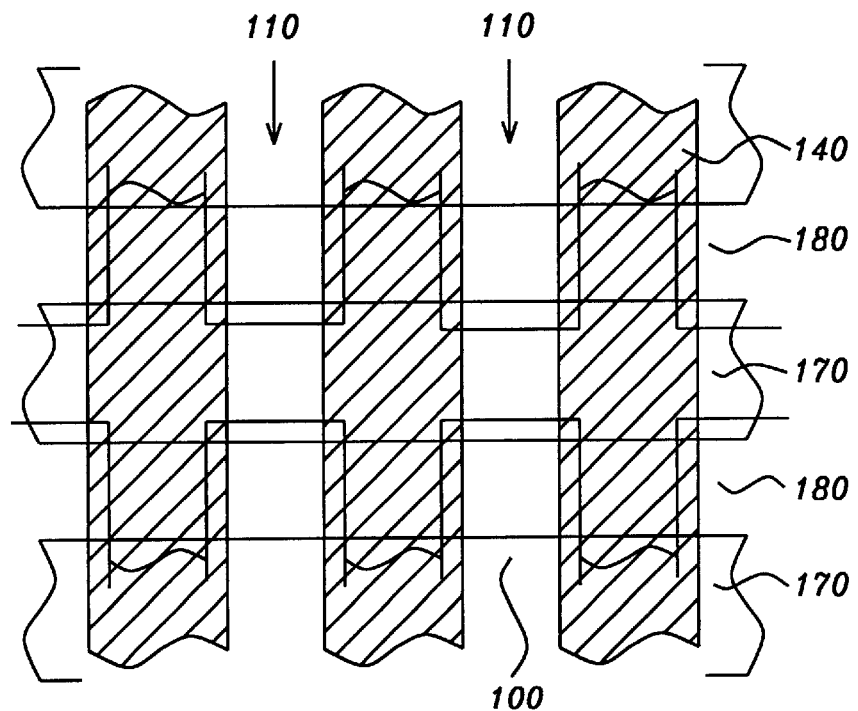
FIG. 2d is a top view of a substrate of FIG. 2c showing the forming of a silicon nitride layer and an opening orthogonal to the opening of FIG. 2c, according this invention.
Figure 2E:
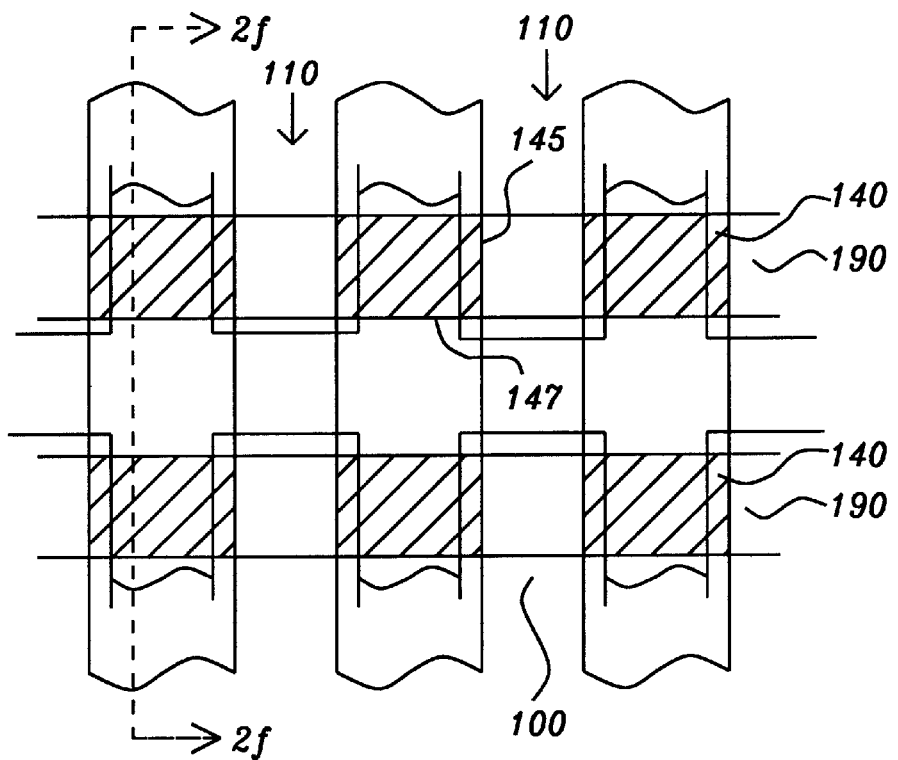
FIG. 2e is a top view of a substrate of FIG. 2c showing the forming of an oxide layer and the removal of the silicon nitride layer, according this invention.
Figure 2F:
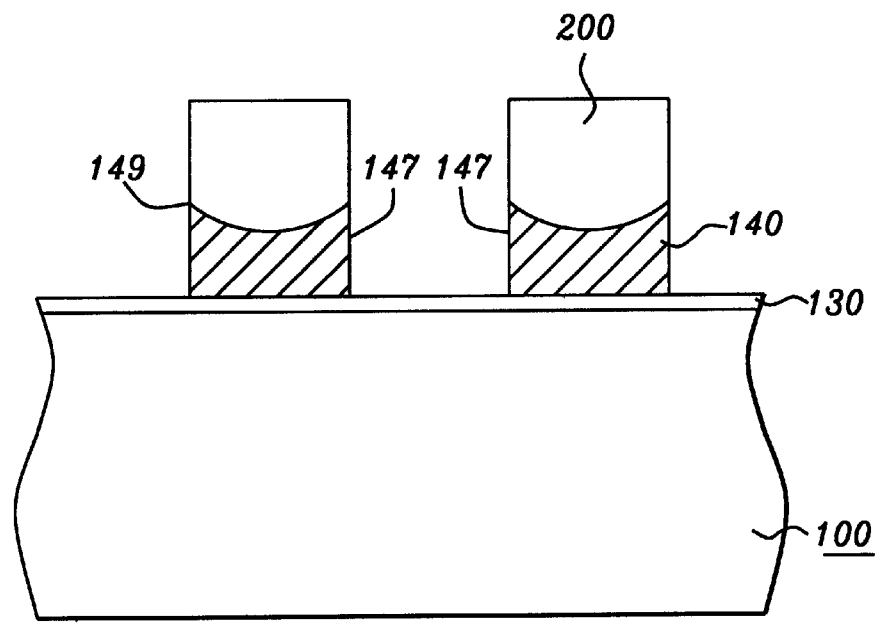
FIG. 2f is a cross-sectional view of a portion of the substrate taken at 2f—2f of FIG. 2e showing the forming of the oxide cap and the amorphous silicon floating gate of this invention.

Blanket SiN layer (not shown) is next patterned with openings (180) as shown in FIG. 2d with a second photomask (not shown). The patterning is accomplished with an etch recipe comprising $CF_4$, $CHF_3$, Ar, where the etching exposes $\alpha$-Si layer (140) in openings (180) as shown in the same FIG. 2d. Then, as a main feature and key aspect of the present invention, an oxide layer, reference numeral (200) in FIG. 2f is formed over the substrate, including over the exposed $\alpha$-Si layer (140) in opening (180) as shown in both FIGS. 2e and 2f. The silicon nitride layer is removed and amorphous silicon layer (140) is etched to form the second edge of the newly completed $\alpha$-Si floating gate of the invention, including the oxide cap (200) of FIG. 2f.

Forming oxide layers are known in the art and can be formed such as by reacting dichlorosilane with nitrous oxide at a temperature between about 850 to 950° C. For the preferred embodiment of the present invention, oxide layer (200) is preferably formed, to a thickness between about 200 to 500 Å, by thermal oxidation at a temperature between about 850 to 950° C. The removal of the silicon nitride layer is accomplished by using a wet solution of $H_3PO_4$, or, phosphoric acid. Then the exposed floating gate region without oxide is dry etched using recipe $CF_4$, $Cl_2$, HBr.

The completion of the flash memory cell is accomplished by forming an intergate oxide layer over the oxide cap, followed by forming a control gate (not shown). Preferably, the intergate oxide comprises high temperature oxide (HTO)) having a thickness between about 150 to 200 Å, and that the control gate comprises amorphous silicon having a thickness between about 2000 to 3000 Å.

It will be appreciated by those skilled in the art that depositing an oxide layer and then etching to form an oxide cap over the floating gate as shown in FIG. 2f—that is, in place of forming a conventional bulbous polyoxide from a polysilicon layer—provides sharper tip (149) which in turn improves the erase speed of the cell. The sharpness of the tip is further enhanced by the underlying amorphous silicon which has smoother and smaller grain size. In other words, the method disclosed here circumvents, what is known as the rounding effect of the floating gate structure. Also, the use of tapered openings in this method of forming the floating gate provides a wider margin of alignment between the floating gate and the device area. Though these numerous details of the disclosed method are set forth here, to provide an understanding of the present invention, it will be obvious, however, to those skilled in the art that these specific details need not be employed to practice the present invention. At the same time, it will be evident that the same methods may be employed in other similar process steps that are too many to cite, such as using polysilicon in place of amorphous silicon in the forming of the control gate.

That is to say, while the invention has been particularly shown and described with reference to the preferred embodiments thereof, it will be understood by those skilled in the art that various changes in form and details may be made without departing from the spirit and scope of the invention.

What is claimed is:

1. A method of forming a novel flash memory cell comprising the steps of:

providing a substrate having active regions defined by shallow trench isolation regions in said substrate;

forming a gate oxide layer over said substrate;

forming a silicon (Si) layer over said gate oxide layer;

forming a first nitride layer over said Si layer;

forming a tapered opening in said first nitride layer along a first axis of said substrate over said STI regions to form a first hardmask over said Si layer;

using said first hardmask to etch underlying said Si layer to expose STI regions and form a fist edge of a Si floating gate;

removing said first nitride layer;

forming a second nitride layer over said Si layer;

forming a second opening in said second nitride layer along a second axis of said substrate to form a second hardmask exposing portions of said Si layer in said second openings;

using said second hardmask to form an oxide cap over said Si layer exposed in said second openings;

removing said second nitride layer;

etching said Si layer adjacent said oxide cap to form a second edge to complete the forming of said Si floating gate;

forming an intergate oxide layer over said Si floating gate;

forming an Si control gate over said intergate oxide layer;

forming an intergate oxide layer over said oxide cap; and forming a control gate over said intergate oxide layer.

2. The method of claim 1, wherein said silicon layer comprises amorphous silicon (—Si) or polysilicon (poly-Si).

3. The method of claim 1, wherein said gate oxide layer is formed by thermal growth at a temperature between about 850 to 950° C.

4. The method of claim 1, wherein said gate oxide layer has a thickness between about 80 to 100 Å.

5. The method of claim 1, wherein said Si layer has a thickness between about 900 to 1500 Å.

6. The method of claim 1, wherein said first nitride layer is silicon nitride (Si3N4).

7. The method of claim 1, wherein said first nitride layer has a thickness between about 500 to 1000 Å.

8. The method of claim 1, wherein said forming said tapered openings is a accomplished with a recipe comprising gases Ar, CHF3, C4F8 .

9. The method of claim 1, wherein said tapered opening has a taper between about 0.065 to 0.075 micrometers ($\mu$m).

10. The method of claim 1, wherein said etching said —Si to form a first edge of a floating gate is accomplished with a recipe comprising CF4, Cl2, HBr.

11. The method of claim 1, wherein said second nitride layer is silicon nitride (SiN).

12. The method of claim 1, wherein said second nitride layer has a thickness between about 500 to 1000 Å.

13. The method of claim 1, wherein said forming said second opening in said second nitride layer is accomplished with a recipe comprising Ar, CHF3, CF4.

14. The method of claim 1, wherein said forming said oxide cap is accomplished by thermal oxidation.

15. The method of claim 1, wherein said oxide cap has a thickness between about 200 to 500 Å.

16. The method of claim 1, wherein said etching said —Si layer to form a second edge of said floating gate is accomplished with a recipe comprising CF4, Cl2, HBr.

17. The method of claim 1, wherein said intergate oxide layer has a thickness between about 150 to 200 Å.

18. The method of claim 1, wherein said control gate comprises Si and has a thickness between about 2000 to 3000 Å.

19. A novel flash memory cell comprising:

a substrate having active regions defined by shallow trench isolation regions in said substrate;

a silicon floating gate overlying but separated from said substrate by a gate oxide layer wherein said silicon floating gate comprises a top surface with a concave topology in two axis;

an oxide cap formed over said Si floating gate;

an intergate oxide layer over formed over said oxide cap over said Si floating gate; and an Si control gate formed over said intergate oxide layer.

20. The flash memory cell of claim 19, wherein said Si floating gate has a thickness between about 900 to 1500 Å.

21. The flash memory cell of claim 19, wherein said oxide cap has a thickness between about 200 to 500 Å.

22. The flash memory cell of claim 19, wherein said intergate oxide layer has a thickness between about 150 to 200 Å.

23. The flash memory cell of claim 19, wherein said Si control gate has a thickness between about 2000 to 3000 Å.

* * * * *